United States Patent [19]

Jenne

[11] 3,794,862

[45] Feb. 26, 1974

[54] SUBSTRATE BIAS CIRCUIT

[75] Inventor: Frederick B. Jenne, Huntington Beach, Calif.

[73] Assignee: Rockwell International Corporation, El Segundo, Calif.

[22] Filed: Apr. 5, 1972

[21] Appl. No.: 241,171

[52] U.S. Cl. .......... 307/304, 317/235 G, 317/235 R

[51] Int. Cl. .......... H01l 19/00

[58] Field of Search .......... 307/305, 251, 279, 304; 317/235 G

[56] References Cited

UNITED STATES PATENTS 3,609,414 9/1971 Pleshko .......... 317/235

OTHER PUBLICATIONS

IBM Tech. Discl. Bul., "MOSFET Substrate Bias--Voltage Generator" by Frantz et al., Vol. 11, No. 10, March 1969, page 1219.

IBM Tech. Discl. Bul., "Threshold Voltage Control for N-Channel MOSFET Device" by Frantz, Vol. 12, No. 12, May 1920, page 2078.

*Primary Examiner*—Jerry D. Craig

*Attorney, Agent, or Firm*—H. Frederick Hamann; G. Donald Weber, Jr.

[57] ABSTRACT

A semiconductor substrate including a field effect charge pump for injecting charge into the substrate and a field effect transistor circuit, connected between the substrate and a reference voltage source, responsive to the level of substrate charge for clamping the substrate bias voltage at a desired level. By controlling the gate voltage applied to the field effect transistor circuit and the number and arrangement of transistors in the circuit, the substrate bias voltage can be clamped at a value greater than, equal to, or less than the transistor threshold voltage.

5 Claims, 3 Drawing Figures

SUBSTRATE BIAS CIRCUIT

BACKGROUND OF THE INVENTION

Field of the Invention

The invention relates to a substrate bias circuit.

SUMMARY OF THE INVENTION

Briefly, the invention comprises a substrate charge circuit for producing a voltage in a semiconductor substrate embodying the circuit as a function of charge injected into the substrate and a field effect transistor circuit responsive to the substrate voltage for clamping the voltage at a desired substrate bias voltage level. In various embodiments, the field effect transistor circuits are arranged to provide clamped substrate bias voltage levels either less than, equal to, or greater than the threshold voltage of a clamping field effect device of the field effect transistor circuit.

In one embodiment, the substrate charge circuit is provided as a separate field effect circuit embodied within the substrate. The circuit is controlled by a clock signal for producing the substrate charge.

In another embodiment, e.g., a multiphase shift register having a relatively large number of stages (L S I), the substrate charge may be provided from the operating circuits of the substrate as by the charge trapped in the surface states of the dielectric layer interposed between the various circuit electrodes in the underlying substrate. The charge is trapped during the true interval of the clock signal and is released, or pumped into the substrate, during the false interval of the clock signal.

The substrate bias circuit has application in memory circuits which may require circuitry for refreshing, i.e., restoring, the charge on storage capacitances to replace leakage charge. Another solution to the problem has involved the use of an external bias source requiring an additional electrical connection to the substrate.

Therefore, it is an object of this invention to provide an improved substrate bias circuit.

It is another object of this invention to provide a substrate bias circuit not requiring an external biasing source.

Another object of this invention is to provide a substrate bias circuit in which the substrate charge is generated by a field effect circuit embodiment in the substrate.

It is still a further object of this invention to provide a substrate bias circuit comprising a circuit embodied within the substrate for producing a substrate bias voltage level and a field effect transistor circuit embodied within the substrate for clamping the level of the bias voltage.

Still another object of this invention is to provide a substrate bias circuit for minimizing the effects of leakage charge which may interfere with information stored by capacitances at least partially embodied within the substrate.

These and other objects of this invention will become more apparent when taken in connection with the description of the drawings, a brief description of which follows:

DESCRIPTION OF PREFERRED EMBODIMENTS

Figure 1:
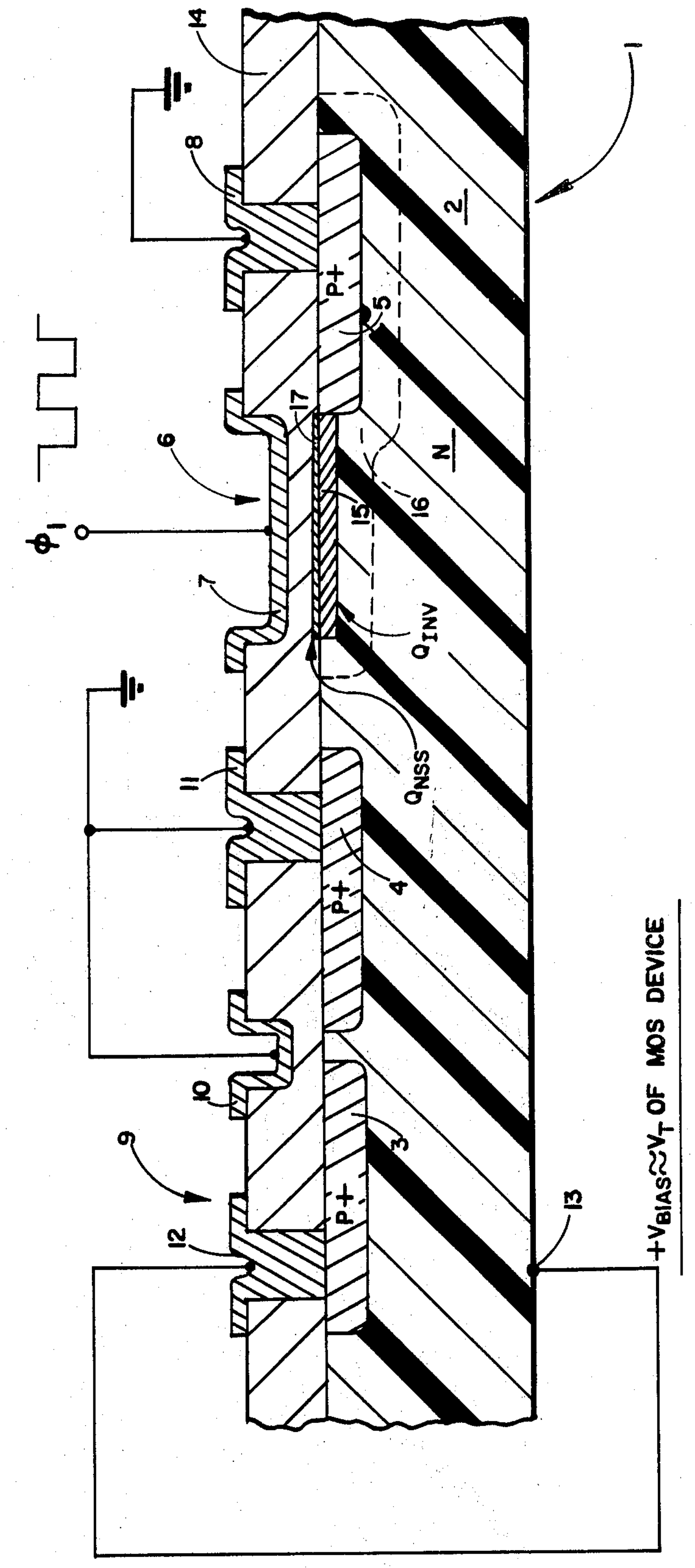
FIG. 1 is a cross-sectional view of one embodiment of a circuit for generating and clamping substrate bias voltage produced by charge pumped into the substrate.

FIG. 1 is an illustration of one embodiment of the bias circuit 1 comprising an N type substrate 2 in which have been formed P regions 3, 4, and 5 which can be produced by known processes and techniques. For example, boron impurities can be diffused through openings in a silicon dioxide dielectric layer disposed on the surface of a single crystal silicon substrate to form the $P^+$ regions in the N type substrate.

Field effect circuit 6 comprising gate electrode 7 and source electrode 8, supplies positive charge to be injected into the substrate 2. The supplying of positive charge for the substrate may be described as "pumping" charge into the substrate. Clock signal $\phi_1$, connected to the gate electrode 7, controls the charge pumping operation.

The source electrode 8, is connected to electrical ground as a voltage reference level. In other embodiments, the reference level may be provided by other voltage levels such as a positive or negative voltage. The substrate voltage is charged as a function of the reference voltage. The clock signal is seen to oscillate between voltage levels representing true and false logic states. Charge is pumped into the substrate during the transition from a true to a false state as will be described subsequently.

The clamping field effect transistor circuit 9 includes gate and drain electrodes 10 and 11 respectively which are connected at a common point to a reference voltage level represented by electrical ground. The source electrode 12 is connected to the substrate at a point represented by numeral 13. As can be seen from the figure, the dielectric layer 14 disposed over the substrate 2 is thinned under the gate electrodes 7 and 10 to permit control over the underlying substrate regions in accordance with field effect operation. Openings are provided through the dielectric for accommodating electrodes 8, 11 and 12 as is well known to persons skilled in the art of forming field effect devices. The process for forming a metal layer such as aluminum over the surface of the dielectric, masking the aluminum layer followed by an etching step to form the electrodes is well known to persons skilled in the art.

In operation, when the clock signal becomes more negative (true state) than the threshold voltage level of the underlying substrate material, the N type material is inverted, i.e. changes from N type material to P type material. The inverted region is identified by numeral 15 and the depletion region is identified by 16. The holes required for the inversion layer 15 are supplied from the P region 5 which is connected through source electrode 8 to electrical ground. In addition, the fast surface states (17) in the dielectric layer 14 under gate electrode 7 are also filled with holes. Inversion occurs when the clock signal is true.

When the clock changes from true to false (less negative than the threshold voltage), the depletion region 16 collapses. If the clock has a relatively fast transition time from the true to the false state, most of the holes in the inversion layer 15 do not have a sufficient period of time in which to return to the P region 5. The holes remaining in the inversion layer are then injected into the substrate 2 along with the holes supplied from the fast surface states in the dielectric layer 14. The charge from the inversion layer is identified as $Q_{INV}$ and the charge from the fast surface states is identified as $Q_{NSS}$.

The net transfer of charge, i.e. holes from the inversion region and the dielectric layer, generates a current flow in the substrate which is floating relative to the reference voltage level. Since the injection of holes or charge into the substrate occurs during each clock transition from true to false, a constant substrate current results.

This current causes the substrate to go positive and provides a bias voltage level for the substrate. When the bias voltage level exceeds the threshold voltage of field effect transistor circuit 9, the transistor becomes conductive and the substrate is clamped to the threshold voltage of the field effect transistor circuict 9. Therefore, for the FIG. 1 embodiment, the substrate is biased at a constant voltage level equal to the threshold voltage level of the field effect transistor.

Although FIG. 1 illustrates a separate charge circuit 6, it should be understood that for a large scale integrated circuit array, each clocked field effect transistor can supply a positive charge to the substrate during each clock cycle. Assuming a relatively large number of field effect transistors, the charge from the fast surface states under the gate electrodes or charge from the gate electrode inversion regions can provide a sufficient charge and therefore voltage for biasing the substrate at a desired voltage level. In the latter embodiment, the circuit 9 would also be required to clamp the bias voltage at a desired level.

Figure 2:
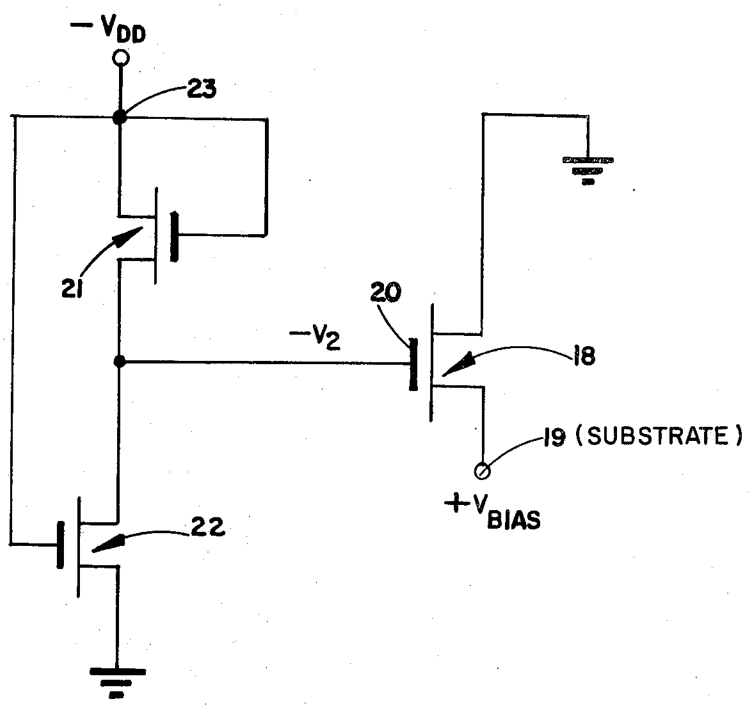
FIG. 2 is a schematic illustration of a circuit for producing a substrate bias voltage which is less than the threshold voltage of a field effect transistor.

FIG. 2 is a schematic diagram of another embodiment of the clamping circuit. The circuit comprises field effect transistor 18 connected between the substrate identified by numeral 19 and a reference voltage illustrated by electrical ground. The gate electrode 20 of field effect 18 is connected between field effect transistors 21 and 22.

Field effect transistors 21 and 22 are connected between electrical ground and voltage source $-V_{dd}$. The gate electrodes of the field effect transistors are connected at common point 23 to the voltage source so that the field effect transistors are conductive.

Since both field effect transistors are turned on, the voltage drop across field effect transistor 22 provides a voltage at the gate electrode 20 represented by $-V_2$ for turning field effect transistor 18 on when the difference between substrate voltage at point 19, e.g., $V_{bias}$ (substrate) is approximately equal to the difference between the threshold voltage ($V_T$) of field effect transistor 18 and $-V_2$. As a result of providing a negative voltage on the gate electrode 20 which is less than the threshold voltage of the transistor 18, the substrate voltage can be less than the threshold voltage of the field effect transistor 18.

For example, if the threshold voltage level for the transistor is 8 volts, then ordinarily an 8 volt difference must exist between point 19 and gate electrode 20 in order for the field effect transistor to become conductive. If gate electrode 20 is connected to −4 volts, then point 19 need only reach +4 volts in order for the required threshold voltage to exist.

Figure 3:
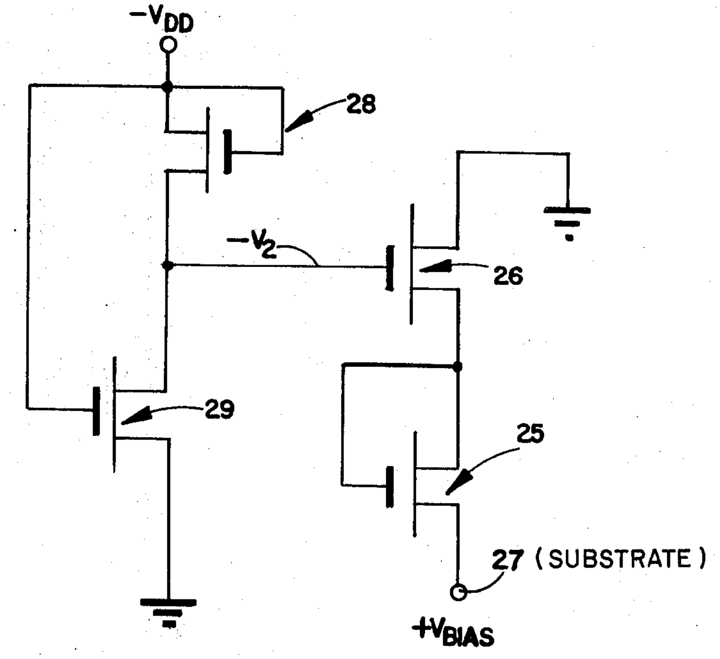
FIG. 3 is a schematic diagram of a circuit for producing a substrate bias voltage which is greater than the threshold voltage of a field effect transistor.

FIG. 3 is a further embodiment of the clamping circuit in which the bias voltage on the substrate may exceed the threshold voltage of the field effect transistor in order to render the field effect transistor conductive. This circuit comprises field effect transistors 25 and 26 connected in electrical series between the substrate identified by numeral 27 and the voltage reference illustrated by electrical ground.

Field effect transistor 25 is equivalent to the field effect transistor 9 as shown in FIG. 1. Field effect transistor 26 in combination with field effect transistors 28 and 29 are equivalent to the circuit shown in FIG. 2.

In operation (assuming the magnitude of $-V_2$ is less than the threshold voltage of field effect transistor 26), the voltage on the substrate represented by point 27 must exceed the threshold voltage of field effect transistor 25 in order for the field effect transistor to become conductive. In addition, the threshold voltage of field effect transistor 26 must also be exceeded in order for that transistor to become conductive. Therefore, the bias voltage on the substrate is clamped or regulated to the threshold voltage of field effect transistor 25 and the threshold voltage of field effect transistor 26 is reduced by the voltage $-V_2$. For example, assuming a threshold voltage of 8 volts, and a $V_2$ voltage of 4 volts, the $V_{bias}$ would be clamped to approximately 12 volts.

Although an N type substrate with P regions has been described, it should be understood that P substrates with N regions could also be used. In that case, voltage polarities could be changed to achieve the proper circuit operation.

What is claimed is:

1. In combination a semiconductor substrate of a first conductivity;

a field effect charge pump included in said substrate to provide a substrate voltage level therein, said charge pump including a source region, a source electrode connected to said source region, and a gate electrode disposed over and insulated from said substrate, means for supplying to said gate electrode a recurring signal having first and second states in order to produce an inverted conductivity type substrate portion underlying said gate electrode during said first state of said recurring signal, said inverted conductivity type substrate portion merging with said source region whereby said charge pump injects charge into said substrate during the transistion of said signal from said first to said second state;

a source of reference voltage; and clamping means included in said substrate for clamping said substrate at a desired voltage level, said clamping means including at least a first field effect transistor having source, drain and gate electrodes and exhibiting a characteristic threshold voltage between the gate electrode and a remaining electrode thereof, means for connecting the source-to-drain path of said first transistor in series between said substrate and said source of reference voltage, and means for connecting the gate electrode of said first transistor to a source of gate voltage for establishing the substrate voltage level at which said first transistor is rendered conductive to clamp said substrate at said desired voltage level.

2. The combination of claim 1 wherein the gate electrode of said first transistor is connected to said source of reference voltage whereby said first transistor is rendered conductive when the difference between said substrate voltage and said reference voltage at least equals the threshold voltage of said first transistor.

3. The combination of claim 1 wherein the gate electrode of said first transistor is connected to a source of gate voltage different in value from said reference voltage whereby said first transistor is rendered conductive when the difference between said substrate voltage and said reference voltage is less than the threshold voltage of said first transistor.

4. The combination of claim 3 wherein said means for connecting the gate electrode of said first transistor to a source of gate voltage includes a pair of series connected field effect transistors, the gate electrode of said first transistor being connected to a common point between said pair of transistors.

5. The combination of claim 1 wherein said clamping means includes a second field effect transistor having source, drain and gate electrodes and exhibiting a characteristic threshold voltage between the gate electrode and a remaining electrode thereof;

means for connecting the source-to-drain paths of said first and second transistors in series between said substrate and said source of reference voltage; and means for connecting the gate electrodes of said first and second transistors to respective sources of gate voltage for establishing the substrate voltage at which said first and second transistors are rendered conductive to clamp the substrate at said desired level, said first and second transistors becoming conductive when the difference between said substrate voltage and said reference voltage is at least equal to the difference between the threshold voltages of said first and second transistors and said gate voltages supplied by said sources of gate voltage, whereby the difference between said substrate voltage and said reference voltage exceeds the threshold voltage of said first transistor

* * * * *

PO-1050
(5/69)

UNITED STATES PATENT OFFICE
CERTIFICATE OF CORRECTION

Patent No. 3,794,862 Dated February 26, 1974

Inventor(s) Frederick B. Jenne'

It is certified that error appears in the above-identified patent and that said Letters Patent are hereby corrected as shown below:

Column 3, line 23, change "circuict" to --circuit--.

Column 4, line 27, change "4" to -- -4 --.

Signed and sealed this 2nd day of July 1974.

(SEAL)
Attest:

EDWARD M. FLETCHER,JR.
Attesting Officer

C.MARSHALL DANN
Commissioner of Patents